United States Patent
Szulczyk

(10) Patent No.: US 9,251,931 B2
(45) Date of Patent: Feb. 2, 2016

(54) NBTI SUPERCONDUCTOR WITH PERIPHERALLY DISTRIBUTED AL BLOCK FOR WEIGHT REDUCTION

(71) Applicant: Bruker EAS GmbH, Hanau (DE)

(72) Inventor: Andreas Szulczyk, Linsengericht (DE)

(73) Assignee: Bruker EAS GmbH, Hanau (DE)

( * ) Notice: Subject to any disclaimer, the term of this patent is extended or adjusted under 35 U.S.C. 154(b) by 430 days.

(21) Appl. No.: 13/916,646

(22) Filed: Jun. 13, 2013

(65) Prior Publication Data

US 2013/0345062 A1    Dec. 26, 2013

(30) Foreign Application Priority Data

Jun. 25, 2012  (DE) .......................... 10 2012 210 770

(51) Int. Cl.
| | |
|---|---|
| H01L 39/00 | (2006.01) |
| H01B 12/00 | (2006.01) |
| H01B 12/02 | (2006.01) |
| H01L 39/14 | (2006.01) |
| H01L 39/24 | (2006.01) |

(52) U.S. Cl.
CPC .............. *H01B 12/02* (2013.01); *H01L 39/14* (2013.01); *H01L 39/2406* (2013.01); *Y10T 428/1275* (2015.01)

(58) Field of Classification Search
CPC ..... H01L 39/12; H01L 39/14; H01L 39/2406; H01L 39/2409; H01B 12/06; H01B 12/10; Y10S 505/806; Y10S 505/887
USPC ............... 505/230, 231, 232, 430, 431; 174/125.1; 29/599; 148/96; 428/652
See application file for complete search history.

(56) References Cited

U.S. PATENT DOCUMENTS

| | | | | |
|---|---|---|---|---|
| 4,506,109 | A | * | 3/1985 | Onishi et al. ............... 174/125.1 |
| 4,652,697 | A | * | 3/1987 | Ando et al. ................ 174/125.1 |
| 5,088,183 | A | * | 2/1992 | Kanithi ............................ 29/599 |
| 5,189,386 | A |   | 2/1993 | Tada |
| 2003/0024730 | A1 | * | 2/2003 | Otto et al. ................... 174/125.1 |

FOREIGN PATENT DOCUMENTS

| | | |
|---|---|---|
| EP | 0 067 591 | 12/1982 |
| GB | 1 201 774 | 8/1970 |
| JP | 02273417 | 11/1990 |
| JP | 03192611 | 8/1991 |
| JP | 06203653 | 7/1994 |
| JP | 09-282953 | 10/1997 |
| WO | 2008/121764 | 10/2008 |

\* cited by examiner

*Primary Examiner* — Colleen Dunn
(74) *Attorney, Agent, or Firm* — Paul Vincent

(57) ABSTRACT

A superconducting wire (1; 31), contains NbTi superconducting material and Cu, with one enclosing tube (2), in particular, a copper enclosing tube. At least three Al blocks (3a-3c) are disposed peripherally distributed in the enclosing tube (2) and at least three sections containing NbTi (4a-4c) are also disposed peripherally distributed in the enclosing tube (2) and separate the Al blocks (3a-3c) from one another in the peripheral direction. The Al blocks (3a-3c) each make large-surface contact with their adjacent sections containing NbTi (4a-4c). A stabilized NbTi superconducting wire is thereby provided, which has low weight and which can be manufactured at low cost. The superconducting wire has a reduced risk of crack formation, in particular, during wire drawing.

16 Claims, 3 Drawing Sheets

NBTI SUPERCONDUCTOR WITH PERIPHERALLY DISTRIBUTED AL BLOCK FOR WEIGHT REDUCTION

This application claims Paris convention priority of DE 10 2012 210 770.3 filed Jun. 25, 2012 the entire disclosure of which is hereby incorporated by reference.

BACKGROUND OF THE INVENTION

The invention relates to a superconducting wire, comprising NbTi superconducting material and Cu.

Niobium-titanium (NbTi) is an important superconducting material, which, due to its good plastic deformability (both of a final material and of its precursors), can be deployed in a variety of ways, for example, in superconducting magnet coils or in superconducting cables. The NbTi superconducting material is typically integrated in a superconducting wire, wherein a multiplicity of NbTi filaments usually extends in the longitudinal direction of the superconducting wire.

As part of a drawing process, the wire manufacturing procedure usually includes plastic deformation in a hexagonal outside cross-section in order to simplify the bundling processes of individual NbTi filaments (or also other structures and intermediate structures). The resulting hexagonal elements can then be very compactly disposed, for example, in a copper enclosing tube, cf. U.S. Pat. No. 5,088,183 A referred to in the introduction The superconducting properties of NbTi are only achieved at especially low temperatures, below approx. 9 K, so that the superconductor must be cooled, for example, with liquid helium. Moreover, the superconducting condition cannot be maintained if the magnetic field strength or the electric current density is too high.

NbTi superconducting wires are typically stabilized with copper (Cu), usually with a high degree of purity. The copper runs parallel to the superconducting filaments in the superconducting wire; for example, the copper can constitute a matrix for superconducting NbTi filaments. Copper is a good heat conductor, through which effective cooling of the superconducting NbTi filaments can be achieved. Furthermore, copper exhibits high electrical conductivity. If superconductivity in the superconducting wire is lost locally, the copper provides a parallel electrical current path, limiting a rise in electrical resistance and associated heat generation. With effective cooling, superconductivity can be restored to the local, normally conducting region in the superconductor (stabilizing function). Even if superconductivity cannot be restored, the copper protects the superconductor from damage ("melting") by limiting the increase in resistance and thus limiting heat generation, while also efficiently removing the resulting heat (quench protection). Moreover, the copper improves the mechanical strength of the superconducting wire.

Not only is copper an expensive material, it is also relatively heavy with a density of approx. 8.9 g/cm$^3$, which is undesirable for many applications. Alternative materials that can at least partially replace copper are therefore sought for stabilizing NbTi superconductors. Pure aluminum (Al) would be a suitable material in terms of heat conductivity and electrical resistance, and is less expensive than copper and, with a density of 2.7 g/cm$^3$, considerably lighter.

WO 2008/121764 A1 proposes a NbTi superconductor structure with a Cu sleeve, an Al core and multifilament NbTi rods disposed in a ring between them.

While Cu and NbTi are both relatively hard and behave in a similar way when plastically deformed, Al is much softer than NbTi and Cu. When wire containing Al structures, in particular, an Al core, was drawn, cracks extending transversely with respect to the longitudinal direction of the wire were observed in an NbTi superconducting wire. A wire containing cracks is of no use for superconductor applications.

U.S. Pat. No. 5,189,386 discloses a superconductor structure in which an Al core is divided into six sectors by layers of a Cu—Ni alloy. This structure is relatively complex.

U.S. Pat. No. 4,652,697, which is the closest prior art, describes a superconductor structure in which three Al wires and four multifilament wires are bundled, for example, with NbTi filaments and a copper matrix. One of the multifilament wires is disposed in the center of the superconductor structure. The structure is held together by PbSn solder. It is difficult to process solder in wire production and, as an additional material, it can additionally aggravate the problem of crack formation.

JP 09 282953 A describes an Nb$_3$Al superconductor wire in which Nb$_3$Al filaments are embedded in a copper matrix. Embedded additional structures made of Nb or Ta can be used for strengthening. In one embodiment, additional structures with an Al rod in a Cu tube are proposed.

The object of the invention is to propose a stabilized NbTi superconducting wire, which has a low weight, which can be manufactured at low cost, wherein the superconducting wire has a reduced risk of crack formation (especially during wire drawing).

SUMMARY OF THE INVENTION

This object is achieved with a superconducting wire comprising NbTi superconducting material and Cu, with
- one enclosing tube, in particular, a copper enclosing tube,
- at least three Al blocks, which are disposed peripherally distributed in the enclosing tube,
- and with at least three sections containing NbTi, which are also disposed peripherally distributed in the enclosing tube, and which separate the Al blocks from one another in the peripheral direction, wherein the Al blocks each make large-surface contact with their adjacent sections containing NbTi.

According to the invention, copper is partially replaced with aluminum in the superconducting wire for stabilization purposes, wherein three Al blocks are usually provided. In the wire cross-section (perpendicular to the longitudinal direction of the wire), the Al blocks are disposed peripherally distributed and mutually separated by sections containing NbTi, i.e. Al blocks and sections containing NbTi alternate in the peripheral direction. The Al blocks are considerably lighter than equivalent volumes of copper material and also less expensive. In particular, the weight per meter (that is, the mass of the superconducting wire per length in the longitudinal direction) can be considerably reduced compared to the exclusive use of copper for stabilizing the superconducting material.

By means of an inventive large-surface contact between the sections containing NbTi and the Al blocks, good, direct heat and current transmission is ensured; typically, the large-surface contact in cross-section is made over at least 20% of the wire diameter along boundary surfaces of sections containing NbTi and Al blocks running approximately in the radial direction. This achieves a very good stabilizing function and also enables the overall structure of the superconducting wire to be kept simple.

The enclosing tube can also improve stabilization, in particular, if it is constituted as a Cu enclosing tube. Furthermore, the enclosing tube can properly hold together the Al blocks and sections containing NbTi.

The inventive superconducting wire can easily be constituted without solder (in particular, without PbSn solder). In particular, no solder is required to achieve sufficient thermal conduction or current conduction contact between the Al blocks and the NbTi superconducting material in the sections containing NbTi; likewise, no solder is required to hold together the overall structure of the superconducting wire. Within the scope of the invention, contamination of the superconducting wire by foreign bodies can be kept very low.

The Al blocks consist of solid aluminum material, typically with a purity of 99 atom % or higher. The cross-section surface of an inventive superconducting wire typically has a proportion of at least 10% aluminum, preferably at least 20% aluminum. The sections containing NbTi are preferably only made up of Nb, Ti, and Cu (with the exception of dopants and impurities of under 1 atom %). Every section containing NbTi contains at least one, typically however a multiplicity of NbTi filaments, which extend in the longitudinal direction of the superconducting wire. The copper (Cu) structures in the superconducting wire typically also have a high degree of purity (preferably >99 atom % Cu); however, they can also be constituted with an alloy containing copper (preferably ≥80 atom % Cu, especially preferably ≥90 atom % Cu in the Cu alloy); this applies, in particular, for the case of a Cu enclosing tube, a Cu shaped tube, Cu filler plates, and Cu blocks (see below).

The contact surfaces between the materials with differing deformation properties, aluminum on the one hand and copper and niobium-titanium on the other hand, are inventively divided among at least three Al blocks distributed azimuthally (in the peripheral direction). As a result, the build-up of mechanical stress resulting from reforming processes (for example, during wire drawing) in the peripheral direction with respect to the entire superconducting wire is interrupted a corresponding number of times, which counteracts the formation of cracks. On the other hand, the constitution of the Al blocks from solid material reduces the contact surface to aluminum; material inside the Al blocks is hardly involved in the build-up of stress. In practice, the inventive structure has proven very resistant to the formation of cracks. In particular, very good results have been achieved with a low number of azimuthally distributed Al blocks (no more than six Al blocks, preferably three or four Al blocks), no more than one additional central Al block (with a diameter less than or equal to 30% of the diameter of the superconducting wire, preferably less than or equal to 25% of the diameter of the superconducting wire) and typically no additional Al structures in the superconducting wire.

Overall, the inventive superconducting wire typically has a nearly circular cross-section, but can have an alternative (external) contour, for example, a hexagonal contour.

Overall, a weight-reducing NbTi-based superconducting wire can be provided with the invention, which, with low manufacturing costs, only results in a small boundary surface between Al on the one hand and Cu and NbTi on the other hand, so that favorable reforming behavior (especially during reforming by extrusion and drawing) with a low risk of cracking is maintained. In the manufacturing process, the danger of inclusion of foreign particles is also low, which, on the one hand, reduces the quench risk and, on the other hand, allows high heat and current conductibility of the protective structures made of Al and Cu.

In an advantageous embodiment of an inventive superconducting wire, the sections containing NbTi are constituted by one or more deep-hole drilled Cu blocks, wherein NbTi structures, which each contain one or more NbTi filaments, are inserted into holes of one or more Cu blocks. In this way, sections containing NbTi can be constituted in a very simple and low-cost way; the Cu block(s) is/are easy to handle in the manufacturing process. The holes and the corresponding NbTi structures typically have a round cross-section. The Cu block(s) also contribute(s) to stabilizing the NbTi filaments (cooling/alternative current paths).

A variant of this embodiment is preferred in which the sections containing NbTi have only one deep-hole drilled Cu block, wherein the Cu block has at least three grooves extending radially inward, each of which contains one Al block. This embodiment is particularly easy to handle in the manufacturing process; the Al blocks merely have to be placed in or pushed into the grooves of the Cu block. The Al blocks are then kept securely in place by the Cu block and the enclosing tube.

In an alternative variant of the above embodiment, the sections containing NbTi are each constituted by one deep-hole drilled Cu block, and one central Cu shaped tube is provided with which the Al blocks and the Cu blocks are contiguous, wherein the shaped tube comprises an additional Al block. By means of the shaped tube and the additional Al block, the proportion of aluminum in the cross-section can be further increased, and thus the weight of the superconducting wire further reduced.

An embodiment is also preferred in which the sections containing NbTi are each constituted as a cluster of contiguous NbTi hexagonal elements, each of which contain one or more NbTi filaments. In this way, a large number of NbTi filaments can be used in a confined space; the manufacture of sections containing NbTi can simply (by means of the number and arrangement of bundled NbTi hexagonal elements) be adapted to different wire geometries.

An embodiment is advantageous that comprises a central Cu shaped tube, with which the Al blocks and the clusters are contiguous, wherein the shaped tube contains an additional Al block, and wherein the Cu shaped tube has an external shape suitable for positioning the NbTi hexagonal elements, in particular wherein the Cu shaped tube is shaped around its complete exterior. By means of the shaped tube and the additional Al block, the proportion of aluminum in the cross-section can be further increased, thus further reducing the weight of the superconducting wire. The shaping permits the dense packing (with low play or even with no play) of the structures of the superconducting wire, in particular in its central region.

An embodiment is also preferred in which the enclosing tube contains several Cu filler plates, wherein the Cu filler plates are shaped in a way that is suitable for positioning the NbTi hexagonal elements of the clusters. The filler plates also permit the dense packing (with low play or even with no play) of the structures of the superconducting wire, in particular in the region of the (typically round) internal contour of the enclosing tube.

An embodiment is also preferred in which the Al blocks have a shape that is suitable for positioning the NbTi hexagonal elements of the clusters, in particular, wherein the Al blocks are shaped around their complete circumference. The shape also permits the dense packing (with low play or even with no play) of the structures of the positioning surfaces between the Al blocks and the clusters.

In an especially preferred embodiment of the inventive superconducting wire, exactly N Al blocks are disposed peripherally distributed in the enclosing tube, and exactly N sections containing NbTi are provided, which are also disposed peripherally distributed in the enclosing tube, and which separate the Al blocks from one another peripherally, wherein N=3, 4, 5 or 6. This range of quantities has proven particularly successful in practice; the entire boundary surface between the Al on the one hand and the Cu and NbTi on the other hand is kept within limits because the Al is distributed among comparatively few Al blocks.

Finally, in a preferred embodiment, the superconducting wire has a circular cross-section. In this way, energy peaks on the superconducting wire—either during operation or during drawing processes—can be minimized. It should be observed, however, that alternative cross-sections, in particular, a hexagonal wire cross-section, are also possible within the scope of the invention, in which case, the superconducting wire may possibly initially be manufactured with a round cross-section, which is transformed into the other wire cross-section in a subsequent drawing process.

Further advantages result from the description and the drawing. Moreover, the features stated above and further below can be used singly or together in any combination. The embodiments shown and described are not intended to be an exhaustive list but are rather examples to explain the invention.

The invention is shown in the drawing and is explained in more detail using the example of the embodiments. The figures show:

DESCRIPTION OF THE PREFERRED EMBODIMENT

Figure 1:
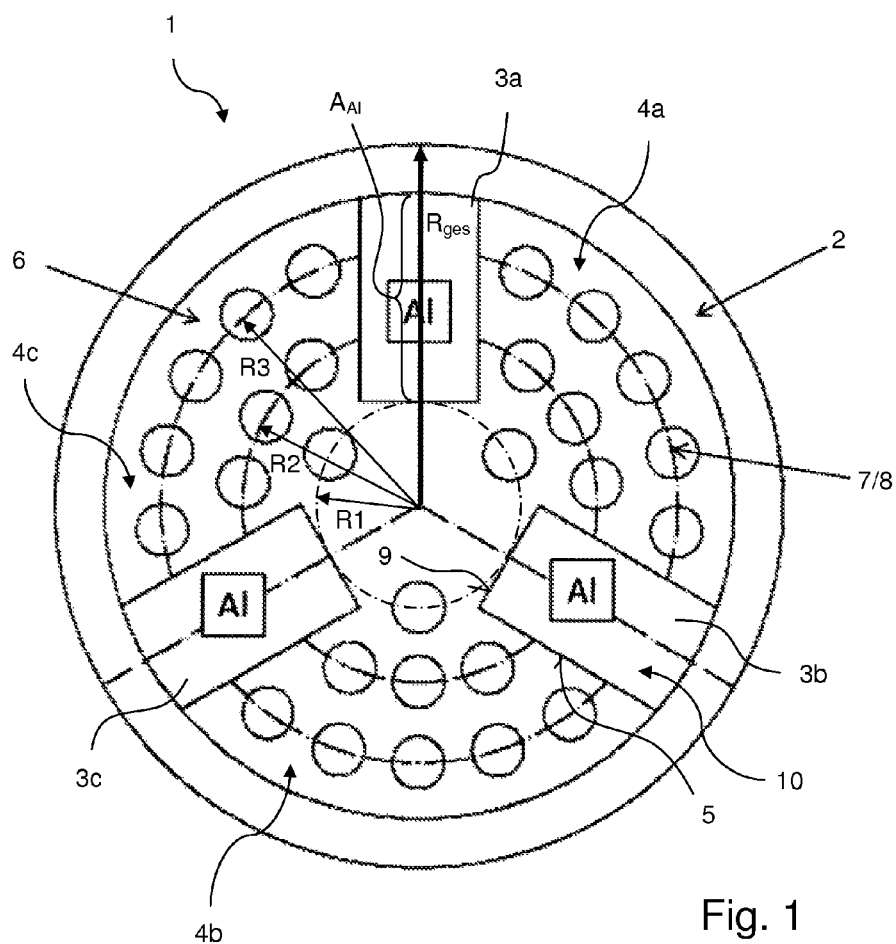
FIG. 1 A schematic cross-sectional view of a first embodiment of an inventive superconducting wire, with three Al blocks and three sections containing NbTi, which are constituted by a deep-hole drilled Cu block.

FIG. 1 illustrates a first embodiment of an inventive superconducting wire 1 in cross-section perpendicular to the longitudinal direction of the superconducting wire 1. The superconducting wire 1 here has a circular cross-section.

In an enclosing tube 2, here a Cu enclosing tube (with a Cu proportion of at least 80 atom %, preferably with a Cu proportion of at least 99 atom %), a plurality (in this case, three) of Al blocks 3a-3c of high purity aluminum (with an Al proportion at least 99 atom %), are disposed azimuthally (peripherally) evenly distributed, wherein the Al blocks 3a-3c are directly contiguous with the enclosing tube 2. The Al blocks 3a-3c are azimuthally separated from one another by (in this case also three) sections containing NbTi 4a-4c, which are also disposed in the enclosing tube 2 and here are also contiguous with the enclosing tube 2.

The sections containing NbTi 4a-4c make contiguous large-surface contact with the Al blocks 3a-3c, cf. the boundary surfaces 5. In particular, no solder provides the contact between the Al blocks 3a-3c and the sections containing NbTi 4a-4c. The contiguous large-surface contact between the Al blocks 3a-3c and the sections containing NbTi 4a-4c ensures good heat transfer and a low electrical resistance, so that the Al blocks 3a-3c can very efficiently contribute to the stabilization of the superconducting material in the sections containing NbTi 4a-4c.

The sections containing NbTi 4a-4c are constituted in this case by a single Cu block 6 (with a Cu proportion of at least 80 atom %, preferably a Cu proportion of at least 99 atom %), in which a multiplicity of continuous drill holes 7 are constituted (deep-hole drilled Cu block). The drill holes 7 are each filled with an NbTi structure 8. Each NbTi structure 8 contains one or more NbTi filaments (the latter are not depicted), which extend in the longitudinal direction of the superconducting wire 1 (i.e. perpendicular to the drawing plane of FIG. 1). The drill holes 7 are azimuthally evenly distributed in the sections containing NbTi 4a-4c, here on three radii R1, R2, R3 (each with reference to the drill-hole center points).

The boundary surfaces 5, which extend approximately in the radial direction between the Al blocks 3a-3c and the sections containing NbTi 4a-4c, extend along approx. 55% of the radius $R_{ges}$ of the superconducting wire 1, cf. portion $A_{Al}$. Approximately 15% of the radius $R_{ges}$ is accounted for by the wall thickness of the enclosing tube 2, and approx. 30% of the radius $R_{ges}$ is accounted for by a central region of the Cu block 6. Generally, it is preferable if the boundary surfaces 5 extend in the radial direction over at least 40% of the radius $R_{ges}$ (bearing in mind that the boundary surface 5 does not have to extend exactly parallel to a radius vector; if necessary, the boundary surface can be projected onto a radius vector).

The center of the superconducting wire 1 in the embodiment shown in FIG. 1 is essentially occupied by Cu material of Cu block 6; toward the center, the Al blocks 3a-3c constitute a further boundary surface 9 that here extends approximately perpendicularly to the direction of a radius vector.

The boundary surfaces 5 and the further boundary surfaces 9 each delimit three grooves 10 milled radially inward into the Cu block 6, into which the Al blocks 3a-3c are inserted.

Figure 2:
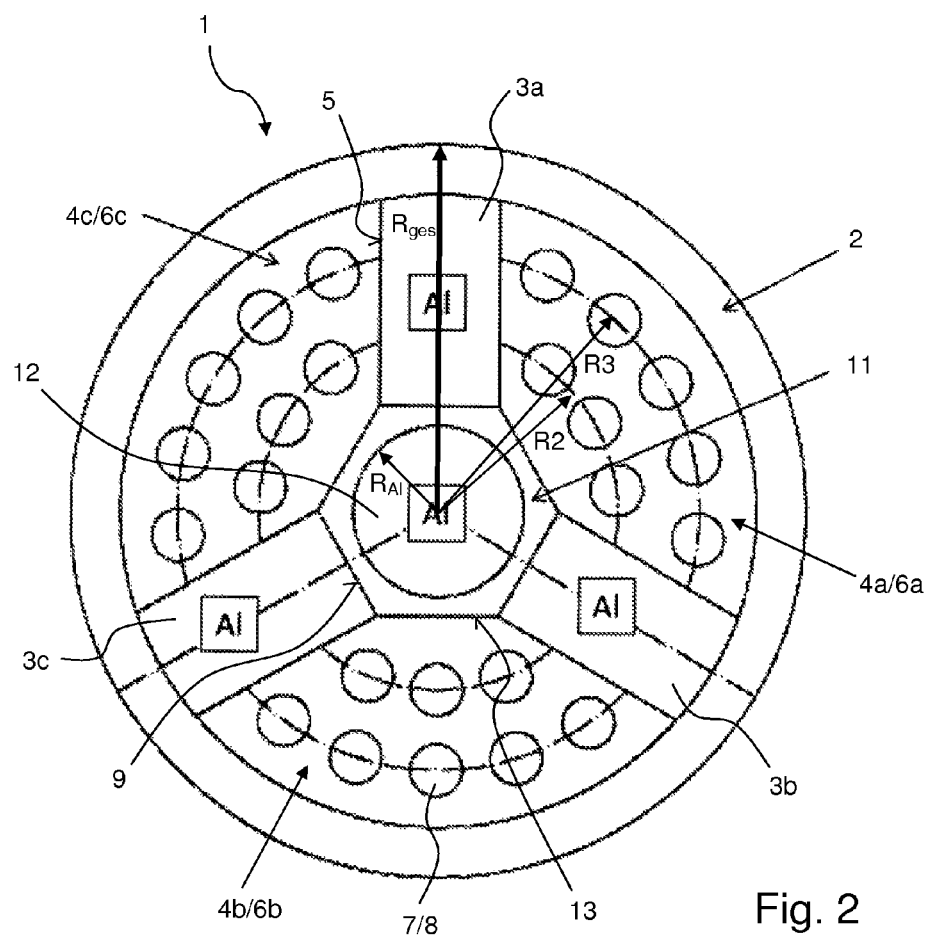
FIG. 2 A schematic cross-sectional view of a second embodiment of an inventive superconducting wire, with three Al blocks and three sections containing NbTi, which are constituted by three deep-hole drilled Cu blocks and with an additional central Al block.

FIG. 2 illustrates a second embodiment of an inventive superconducting wire 1 in cross-section perpendicular to the longitudinal direction of the superconducting wire 1. The main differences from the embodiment of FIG. 1 are presented below.

In this embodiment, the sections containing NbTi 4a, 4b, 4c are each constituted by a dedicated deep-hole drilled Cu block 6a, 6b, 6c, i.e. here there are three Cu blocks 6a-6c, corresponding to the number of sections containing NbTi 4a-4c. One NbTi structure 8 is contained in each of the drill holes 7 of the Cu blocks 6a-6c. The drill holes 7 are here disposed distributed azimuthally evenly on two radii R2 and R3. The sections 4a-4c containing NbTi and/or the Cu blocks 6a-6c separate the Al blocks 3a-3c in the azimuthal direction, wherein the sections containing NbTi 4a-4c and the Al blocks 3a-3c also make direct large-surface contact with boundary surfaces 5. This makes for a good stabilization of the Al blocks 3a-3c.

A Cu shaped tube 11 is disposed in the center of the superconducting wire 1. An additional, in this case round, Al block 12 is inserted into the Cu shaped tube 11; the radius $R_{Al}$ of the additional Al block 12 here amounts to approximately 25% of the radius $R_{ges}$ of the superconducting wire 1. The Cu shaped tube 11 makes large-surface contact at its exterior with the Cu blocks 6a-6c and the Al blocks 3a-3c, cf. boundary surfaces 13 and 9. The inside and outside contour of the Cu shaped tube 11 is adapted to the Al blocks 3a-3c, to the Cu blocks 6a-6c, and the additional Al blocks 12, so that no cavities remain between the named structures of the superconducting wire 1. In the illustrated embodiment, the Cu shaped tube 11 exhibits a hexagonal outside contour. The Al blocks 3a-3c and the Cu blocks 6a-6c still make close contact by their round outside contours with enclosing tube 2, so that here, too, no cavities remain.

Figure 3:
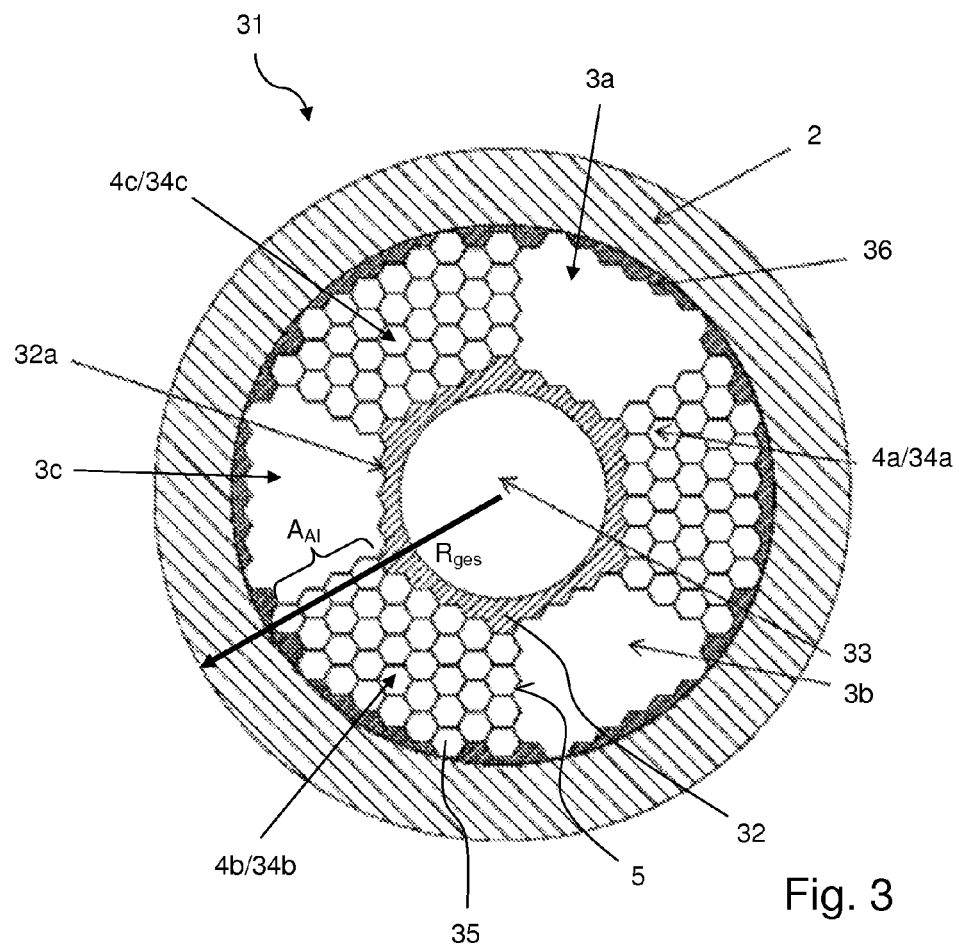
FIG. 3 A schematic cross-sectional view of a third embodiment of an inventive superconducting wire, with three Al blocks and three sections containing NbTi, which are each constituted by clusters of NbTi hexagonal elements and with an additional central Al block.

FIG. 3 shows a third embodiment of an inventive superconducting wire 31, again in cross-section perpendicular to its longitudinal extension.

The superconducting wire 31 exhibits (similar to the embodiment in FIG. 2) in an enclosing tube 2, namely a Cu enclosing tube, three Al blocks 3a-3c, which are disposed peripherally alternating with three sections containing TbTi 4a-4c. The sections containing TbTi 4a-4c are each constituted by a cluster 34a-34c (in cross-section) of contiguous NbTi hexagonal elements 35. Each NbTi hexagonal element 35 has a hexagonal cross-section and contains one or more NbTi filaments (the latter are not depicted), which extend in the longitudinal direction of the superconducting wire 31 (perpendicular to the drawing plane); each cluster 34-34c contains thirty-six NbTi hexagonal elements 35 in this case.

A Cu shaped tube 32 is disposed in the center of the superconducting wire 31, whose exterior is tooth-shaped according to a hexagonal pattern, cf. the circumferential external shaping 32a. An additional Al block 33 is disposed inside the shaped tube 32.

Cu filler plates 36 are disposed around the inside edge of the enclosing tube 2, which are curved to the outside and tooth-shaped to the inside according to a hexagonal pattern. Furthermore, the Al blocks 3a-3c (in cross-section) are tooth-shaped all around their circumference according to a hexagonal pattern. The shaping of the Cu filler plates 36, of the central Cu shaped tube 32, and of the Al blocks 3a-3c permit, together with the clusters 34a-34c, an overall compact (in particular cavity-free) and mechanically stable overall structure of the superconducting wire 1.

In the region of the tooth-shaped boundary surfaces 5, the Al blocks 3a-3c make large-surface contact with the sections containing NbTi 4a-4c and clusters 34a-34c, which again ensures a good heat and current transfer; in this way a good contribution to stabilization by the Al blocks 3a-3c is ensured, wherein the Al blocks 3a-3c contribute less weight to the superconducting wire 1 than comparable Cu structures of the same volume. The boundary surfaces 5 here extend in the radius direction along approx. 40% of the radius $R_{ges}$ of the superconducting wire 1, cf. proportion $A_{Al}$ (which is determined here in a projection onto a radius vector). The central, additional Al block 33 also contributes toward reducing weight and provides a stabilizing function.

Note that generally after assembling a superconducting wire structure according to the invention with Al blocks and sections containing NbTi, preferably no heat treatment above 200° C. is performed to avoid the formation of brittle intermetallic phases of Cu and Al. Typically only cold work (if desired) is performed. The NbTi superconducting material in the superconducting wire is preferably of type "artificial pinning."

I claim:

1. A superconducting wire comprising:
    an enclosing tube;
    at least three Al blocks disposed peripherally distributed in said enclosing tube; and
    at least three sections containing NbTi, said at least three sections also being disposed peripherally distributed in said enclosing tube, wherein said at least three sections thereby separate said Al blocks from one another in a peripheral direction, said Al blocks each making large-surface contact with adjacent said sections containing NbTi, wherein flat contact is obtained between said sections containing NbTi and said Al blocks, said flat contact extending, in cross section, through at least 20% of a diameter of the wire at bordering surfaces between said sections containing NbTi and said Al blocks, said bordering surfaces extending in an approximately radial direction, wherein the superconducting wire contains no solder.

2. The superconducting wire of claim 1, wherein said enclosing tube is a Cu enclosing tube.

3. The superconducting wire of claim 1, wherein said sections containing NbTi are constituted by one or more deep-hole drilled Cu blocks, wherein NbTi structures, which each contain one or more NbTi filaments, are inserted into holes of one or more Cu blocks.

4. The superconducting wire of claim 3, wherein said sections containing NbTi are constituted by only one deep-hole drilled Cu block, wherein said Cu block has at least three grooves extending radially inward, each of which contains one said Al block.

5. The superconducting wire of claim 3, wherein said sections containing NbTi are each constituted by one deep-hole drilled Cu block and one central Cu shaped tube is provided with which said Al blocks and said Cu blocks are contiguous, wherein said shaped tube further comprises an additional Al block.

6. The superconducting wire of claim 1, wherein said sections containing NbTi are each constituted as a cluster of contiguous NbTi hexagonal elements, each of which contain one or more NbTi filaments.

7. The superconducting wire of claim 6, wherein a central Cu shaped tube is provided with which said Al blocks and said clusters are contiguous, wherein said Cu shaped tube comprises an additional Al block, said Cu shaped tube having exterior shaping suitable for positioning said NbTi hexagonal elements.

8. The superconducting wire of claim 7, wherein said Cu shaped tube is shaped all around a circumference thereof.

9. The superconducting wire of claim 6, wherein said enclosing tube contains multiple Cu filler plates, said Cu filler plates being shaped in a way that is suitable for positioning said NbTi hexagonal elements of said clusters.

10. The superconducting wire of claim 6, wherein said Al blocks are shaped in a way that is suitable for positioning said NbTi hexagonal elements of said clusters.

11. The superconducting wire of claim 10, wherein said Al blocks are shaped all around a respective circumference thereof.

12. The superconducting wire of claim 1, wherein exactly N said Al blocks are provided, which are disposed peripherally distributed in said enclosing tube and with precisely N said sections containing NbTi and disposed peripherally distributed in said enclosing tube to peripherally separate said Al blocks from one another, wherein N=3, 4, 5 or 6.

13. The superconducting wire of claim 1, wherein the superconducting wire has a circular cross-section.

14. The superconducting wire of claim 1, wherein the superconducting wire contains no solder.

15. The superconducting wire of claim 1, wherein the superconducting wire has a cross section without cavities.

16. The superconducting wire of claim 1, wherein said Al blocks directly border said enclosing tube.

* * * * *